United States Patent
Midya et al.

(10) Patent No.: US 7,342,518 B2
(45) Date of Patent: Mar. 11, 2008

(54) DIGITAL RATE CONVERTER

(75) Inventors: Pallab Midya, Palatine, IL (US);
Karen K. Hicks, Austin, TX (US);
Anthony R. Schooler, Bartlett, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 927 days.

(21) Appl. No.: 10/761,158

(22) Filed: Jan. 20, 2004

(65) Prior Publication Data

US 2005/0157828 A1    Jul. 21, 2005

(51) Int. Cl.
*H03M 7/00* (2006.01)

(52) U.S. Cl. .................. 341/61; 341/118; 341/119; 375/326

(58) Field of Classification Search ............... 341/118, 341/61, 144, 155, 119, 117; 375/326, 372, 375/355; 708/313; 713/400; 360/51
See application file for complete search history.

(56) References Cited

U.S. PATENT DOCUMENTS

| | | | |
|---|---|---|---|
| 4,989,221 A | 1/1991 | Qureshi | |
| 5,387,910 A | 2/1995 | Medan | |
| 5,497,152 A | 3/1996 | Wilson et al. | |
| 5,892,468 A | 4/1999 | Wilson et al. | |
| 5,909,332 A * | 6/1999 | Spurbeck et al. | 360/51 |
| 6,201,486 B1 | 3/2001 | Chan et al. | |
| 6,208,671 B1 | 3/2001 | Paulos et al. | |
| 6,226,661 B1 * | 5/2001 | Savell | 708/313 |
| 6,226,758 B1 | 5/2001 | Gaalaas | |
| 6,324,235 B1 | 11/2001 | Savell et al. | |
| 6,411,225 B1 | 6/2002 | Ven Der Enden et al. | |
| 6,430,238 B1 | 8/2002 | Sutardja | |
| 6,445,661 B1 | 9/2002 | Wu | |
| 6,462,690 B1 | 10/2002 | Gaboriau | |
| 6,487,672 B1 * | 11/2002 | Byrne et al. | 713/400 |
| 6,535,567 B1 * | 3/2003 | Girardeau, Jr. | 375/372 |
| 6,590,948 B1 * | 7/2003 | Genrich | 375/355 |
| 6,714,603 B2 * | 3/2004 | Ashley et al. | 375/326 |

* cited by examiner

*Primary Examiner*—Jean Bruner Jeanglaude
(74) *Attorney, Agent, or Firm*—David G. Dolezal

(57) ABSTRACT

A method and apparatus of converting a data signal in a digital rate converter including upsampling the input data signal at an input sampling rate to an intermediate data signal at an intermediate sampling rate, where the intermediate data signal sample values are stored in a buffer. A plurality of buffer position values are provided from a subset of buffer positions of the buffer to an interpolator, the subset of buffer positions being dependent upon a position indicator. An output data signal is provided by the interpolator at an output sampling rate, where the value of the output data signal is dependent upon a fractional indicator provided to the interpolator. The input sampling rate is based on a first clock signal and the output sampling rate is based on a second clock signal, wherein the first and second clock signal are independent of each other.

42 Claims, 3 Drawing Sheets

DIGITAL RATE CONVERTER

FIELD OF THE INVENTION

The present invention relates generally to a digital amplifier system, and more specifically, to a sample rate converter in a digital amplifier system.

RELATED ART

Asynchronous sample rate converters are commonly used to convert a digital signal having one sample rate to a digital signal having another sample rate. Asynchronous sample rate converters generally receive a digital signal having a first sample rate as input and output a digital signal having a second sample rate referenced to a local clock. Performing asynchronous sample rate conversion allows processing systems that operate at varying sample rates to process one another's signals.

One analog solution known in the art that performs such an operation uses dependent clock sources and locks the local clock to the input signal. Locking the local clock to the input signal generates jitter in the local clock which is undesirable and degrades overall system performance. In the context of a digital audio amplifier, jitter in the local clock directly translates to noise that may be heard by the end user since the output is created by counting the local clock. In addition, the analog nature of this solution makes it a solution that is difficult to integrate with digital systems.

In another solution known in the art that uses dependent clock sources, the number of input samples and number of output samples are typically sampled only slightly above the Nyquist sampling rate. Selecting sampling rates just above the Nyquist rate generally does not yield the desired audio output in some digital audio amplifiers, since when the number of input samples and output samples are relatively low, the digital audio amplifier is more prone to noise and jitter then when the sampling rate is significantly higher than the Nyquist rate.

Therefore, the need exists for an electronic system that uses digital amplifier system that does not use dependent clock sources to perform asynchronous sample rate conversion.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In a digital amplifier system it may be necessary to synchronize the incoming digital data stream with a low jitter clock source, e.g., for pulse width modulation quantization in a digital amplifier. Various embodiments described herein relate to using an asynchronous sample rate converter to perform such an operation. Although many of the embodiments described herein are in reference to providing the output signal of the asynchronous sample rate converter to a pulse width modulated (PWM) digital amplifier, the embodiments described herein may also use other types of digital amplifiers, such as, for example, a pulse density modulated digital amplifier.

Figure 1:
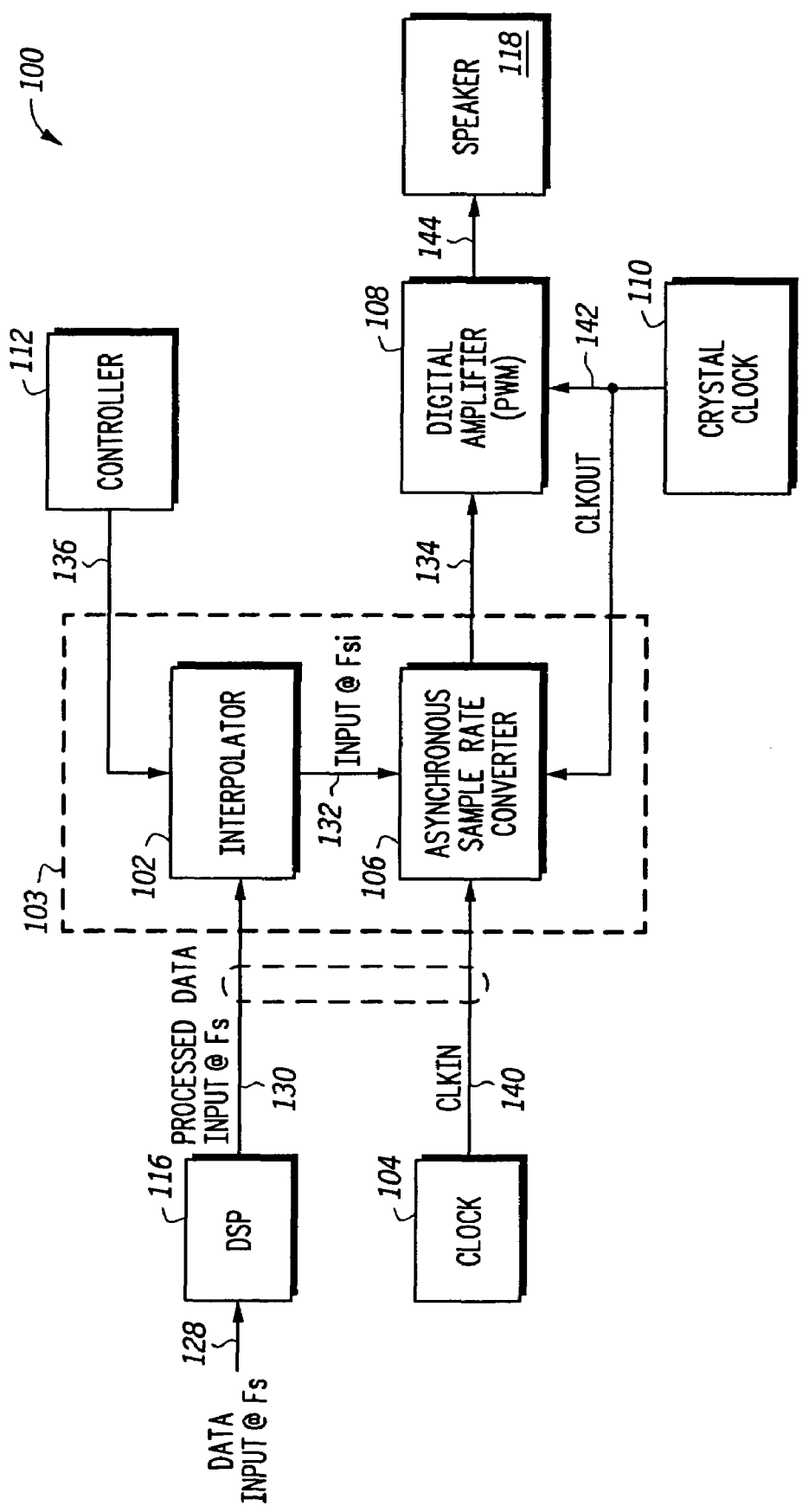
FIG. 1 illustrates, in block diagram form, an electronic system that uses a digital amplifier in accordance with one embodiment of the present invention.

FIG. 1 illustrates, in block diagram form, an electronic system 100 for amplifying digital signals in accordance with one embodiment of the present invention. Electronic system 100 may be any system that amplifies digital signals, such as, for example, a compact disc (CD) player, an MP3 player, a mini-disc player, etc. In one embodiment, electronic system 100 uses an asynchronous sample rate converter (using independent clock sources) to convert a digital signal having one sample rate to a digital signal having another sample rate. The converted digital signal is amplified using a digital amplifier which allows a listener to listen to the amplified digital signal via audio speakers.

In one embodiment shown in FIG. 1, electronic system 100 includes an interpolator 102, asynchronous sample rate converter 106, digital amplifier 108, clock source 104, controller 112, digital signal processor (DSP) 116, speaker 118, and crystal clock 110. DSP 116 is coupled to interpolator 102, which is coupled to controller 112 and asynchronous sample rate converter 106. Asynchronous sample rate converter 106 is also coupled to clock 104, crystal clock 110, and digital amplifier 108. Digital amplifier 108 is coupled to crystal clock 110, asynchronous sample rate converter 106, and speaker 118.

In operation of one embodiment of the present invention, data input signal 128 (data input 128) having a sampling rate Fs is received by DSP 116. DSP 116 processes data input 128 and provides as its output processed data input signal 130 (processed data input 130) also having a sampling rate Fs. Note that in one embodiment of the present invention, DSP 116 may not be present in electronic system 100 and data input 128 may be provided directly to interpolator 102. Interpolator 102 receives processed data input 130 and upsample ratio signal 136 (upsample ratio 136) from controller 112, and upsamples the processed data input 130 at the sampling frequency dictated by an upsample ratio as indicated by upsample ratio 136. In one embodiment, upsample ratio 136 is generated by controller 112 and is based on a "selection" made by the user of electronic system 100. A "selection" may be, for example, when a user selects to listen to a compact disc or an MP3. In one embodiment each selection may utilize a specific upsample ratio defined as $$u = \frac{y}{m1},$$

where y and m1 are constants based on an industry standard being used for electronic system 100. For example when y is 64 and m1 is 4, the upsample ratio is $$u = \frac{y}{m1} = \frac{64}{4} = 16.$$

Interpolator 102 receives processed data input 130 having a sampling rate Fs and upsample ratio 136 from controller 112 and outputs the upsampled processed input signal 132 (upsampled processed input 132) having a sampling rate Fsi. In one embodiment the sampling rate Fsi is determined by multiplying the upsample ratio (as indicated by upsample ratio 136) by the sampling rate Fs of processed data input 130, i.e., Fsi=u·Fs. In one example where a user has selected information from a CD to be amplified by electronic system 100, the upsample ratio is 16, the data input sample rate Fs is 44.1 KHz, and the sampling rate Fsi of the upsampled processed input 132 is 705.6 KHz.

Figure 2:
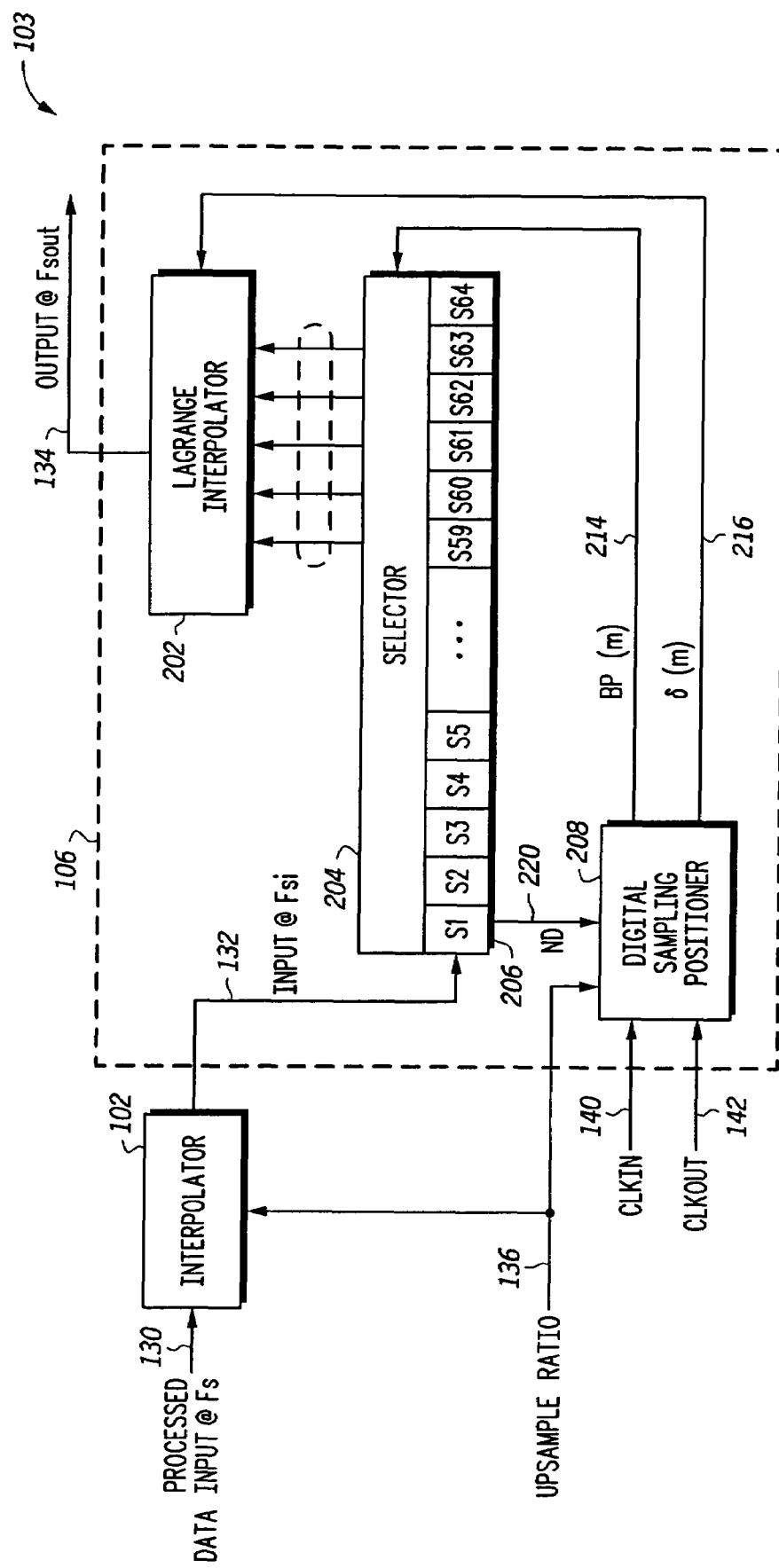
FIG. 2 illustrates, in block diagram form, a digital rate converter, in accordance with one embodiment of the present invention.

Operation of FIG. 1 will be further described with reference to FIG. 2. FIG. 2 depicts one embodiment of a digital rate converter 103 which includes interpolator 102 and asynchronous sample rate converter 106. Asynchronous sample rate converter 106 includes Lagrange interpolator 202, buffer 206, and digital sampling positioner 208. Upsampled processed input 132 is provided to buffer 206 of asynchronous sample rate converter 106 from interpolator 102. Buffer 206 contains a plurality of slots (buffer positions) where each slot is used to store a sample provided as upsampled processed input 132 from interpolator 102. In one embodiment, each sample includes a plurality of bits whose sample size is dependent upon the accuracy of the analog-to-digital converter being used by electronic system 100. For example, for a high quality digital amplifier system the sample size may be 16 or 24 bits wide. Buffer 206 of asynchronous sample rate converter 106 receives upsampled processed input 132 and stores a sample in each slot corresponding to each upsampled process input 132.

Digital sampling positioner 208 of asynchronous sample rate converter 106 (which in one embodiment may be implemented as a servo) receives CLKIN signal 140 (CLKIN 140) from clock 104 having a frequency fclkin, CLKOUT signal 142 (CLKOUT 142) from crystal clock 110 having a frequency fclkout, and new data (ND) signal 220 (new data 220). In one embodiment new data 220 is provided to digital sampling positioner 208 from buffer 206 to indicate whether new data (new upsampled processed input 132) has been input into buffer 206. The clock frequency, fclkin, is y times the sampling rate Fs of processed data input 130. For example, when y is 64 and Fs is 44.1 KHz, the clock frequency is fclkin=y·Fs=64·44.1 KHz=2.8224 KHz. In one embodiment the crystal clock frequency, fclkout, is selected by design and may be, for example, 48 MHz, as is the case for some of the embodiments described herein. For the embodiment shown, clock 104 and crystal clock 110 and their corresponding clock signals, CLKIN 140 and CLKOUT 142, are independent of one another.

Digital sampling positioner 208 uses CLKIN 140 and CLKOUT 142 to generate buffer pointer (BP(m)) 214 and fractional position indicator (δ(m)) 216, where m is the sample index of upsampled output signal 134 (upsampled output 134) provided to digital amplifier 108. In one embodiment buffer pointer 214 is a pointer generated by digital sampling positioner 208 which points to an address in buffer 206 that indicates the location in buffer 206 to select a predetermined number of samples. In one embodiment the selected predetermined number of samples may be consecutive samples and referred to as a predetermined number of consecutive samples. In another embodiment, the predetermined numbers of samples are not consecutive. The buffer pointer location selected may be at any one of the predetermined number of consecutive samples based on the convention used by electronic system 100. Selector 204 uses buffer pointer 214 to select the predetermined number of consecutive samples. For one embodiment, the predetermined number of consecutive samples selected by digital sampling positioner 208 is 5, however, the predetermined number of consecutive samples may vary depending on the desired accuracy of the upsampled output 134.

The predetermined number of consecutive samples (provided from buffer 206) and fractional position indicator 216 (provided from digital sampling positioner 208) are provided to Lagrange interpolator 202. Lagrange interpolator 202 uses both the predetermined number of consecutive samples and the fractional position indicator δ(m) 216 to generate upsampled output 134, which is estimated to be at a time δ(m) from the center sample of the predetermined number of consecutive samples. One advantage that may occur with using a Lagrange interpolator as interpolator 202 is that it may provide for a scalable and accurate interpolation technique that interpolates to a time point between samples. However, other types of interpolators may be used in other embodiments.

Figure 3:
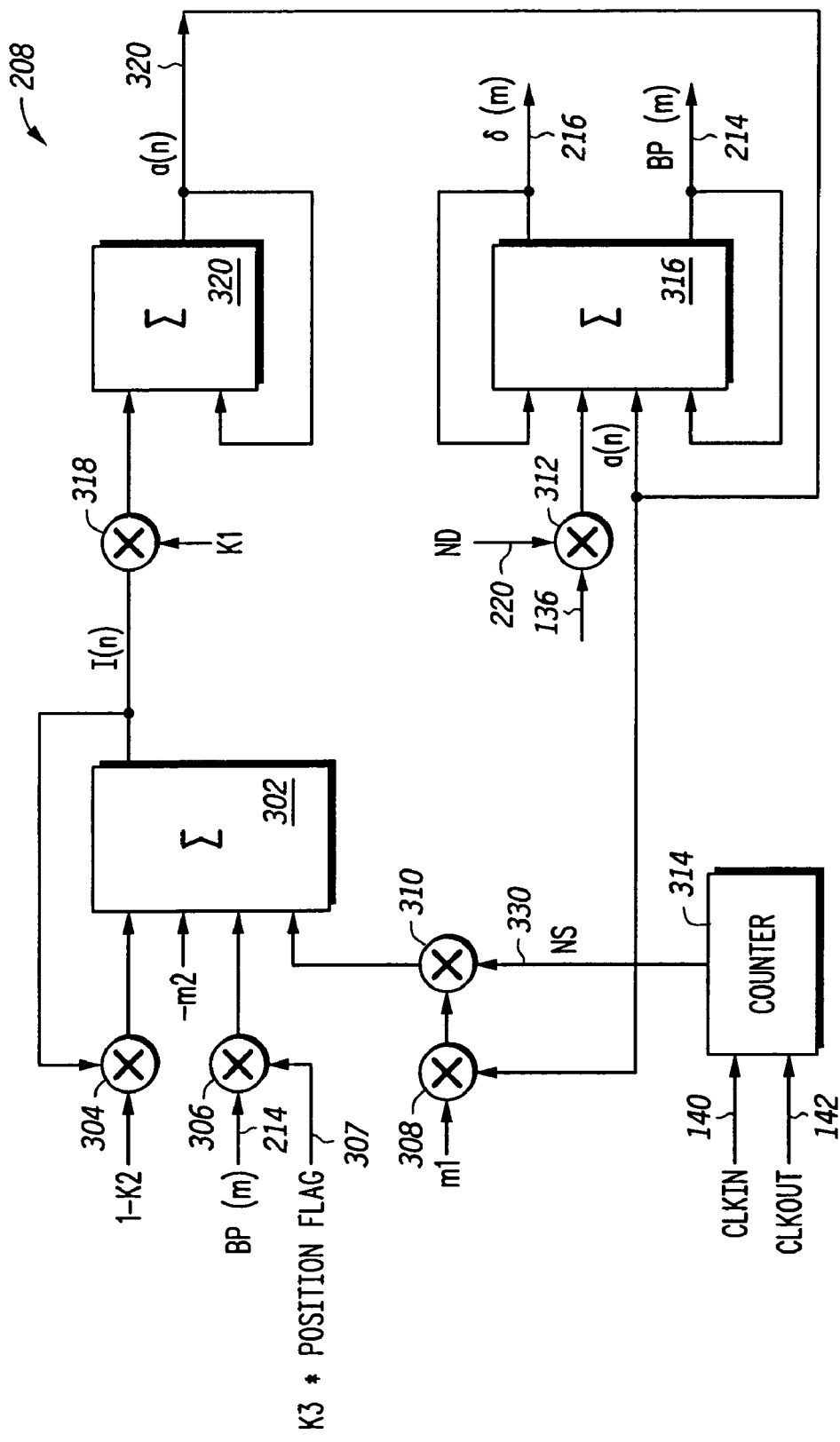
FIG. 3 illustrates a digital sampling positioner, in accordance with one embodiment of the present invention.

FIG. 3 depicts one embodiment of digital sampling positioner 208. Digital sampling positioner 208 includes summation block 302, summation block 320, summation block 316, multiplier 304, multiplier 306, multiplier 308, multiplier 310, and multiplier 312, and counter block 314. The fractional position indicator (δ(m)) 216 and the buffer pointer (BP(m)) 214 outputted by digital sampling positioner 208 will now be discussed further in detail.

Fractional position indicator (δ(m)) 216 is a position indicator generated by digital sampling positioner 208 which indicates the offset (measured in time and normalized to the sample rate Fsout of output 134) between the center sample of the predetermined number of samples and the desired corresponding output by Lagrange interpolator 202 provided as signal 134. In one embodiment fractional position indicator 216 is calculated based on the frequencies fclkin of CLKIN 140 and fclkout of CLKOUT 142 and may be determined by summation block 316 using the following mathematical formulas:

$$\delta(m) = \delta(m-1) + a(n) - \text{round}(\delta(m-1) + a(n)),$$

$$a(n) = (I(n-1) \cdot K1) + a(n-1)$$

$$fclkin = Fs \cdot y,$$

$$m1 = \frac{y}{u},$$

$$m2 = \frac{fclkout}{Fsout},$$

where the upsample ratio, CLKOUT 142 frequency fclkout, and integer y are constant values. The index value m is the sample index of upsampled output 134 and the index value n is the sample index of CLKIN 140. Fractional position indicator 216 is initialized to 0 during the initial summation, i.e., δ(0)=0, and the desired value of Fsout is known prior to performing the initial δ(m) calculation. The term a(n) will be described further in detail below.

In one embodiment of the present invention, the fractional position indicator 216 generated by digital sampling positioner 208 may indicate a position in time within a predetermined range from the center sample of the predetermined number of consecutive samples. The predetermined range may vary from system to system and is dependent upon the interpolator 202 being used for electronic system 100. For one example of the embodiment shown, the fractional position indicator 216 generated by digital sampling positioner 208 indicates a position within half the distance in time from the center sample to the previous sample and half the distance in time from the center sample and the succeeding sample. In another embodiment, fractional position indicator 216 may indicate, for example, a position in time within one-third the distance in time from the center sample to the previous sample and one-third the distance in time from the center sample and the succeeding sample.

As stated previously, buffer pointer 214 is a pointer generated by digital sampling positioner 208 that points to an address in buffer 206 that indicates the location in buffer 206 to select a predetermined number of consecutive samples. Buffer pointer 214 is a function of the fractional position indicator 216, a(n), and the previous buffer pointer position and may be determined by summation block 316 using the following mathematical formula: $BP(m)=\delta(m-1)+a(n)-BP(m-1)$, where m is the sample index of upsampled output 134, $\delta(0)=0$ and $BP(0)=0$.

Referring again to FIG. 3, counter block 314 receives independent clock signals CLKIN 140 and CLKOUT 142 and computes the NS ratio, indicated by NS ratio signal 330 (NS ratio 330). The NS ratio is the ratio of the CLKOUT frequency (fclkout) to the CLKIN frequency (fclkin). For example, when fclkout is 48 MHz and fclkin is 2.8224 MHz, the NS ratio is 17.01. Counter block 314 provides NS ratio 330 to multiplier 310. Multiplier 308 receives m1 (which is the ratio of the CLKIN frequency, fclkin and the sampling rate Fsi ) and a(n), and provides its output to multiplier 310. Multiplier 310 multiplies the output of 308 and NS ratio 330 and provides its output to summation block 302.

Multiplier 304 receives 1−K2, where K2 is a damping integration constant used to increase stability of digital sampling positioner 208, and I(n), which is the output of summation block 302. Multiplier 304 multiplies 1−K2 and I(n) and provides its output to multiplier 318 and summation block 302. Mathematically I(n) may be represented as:

$$I(n)=(n-1)\cdot(1-K2)+\{a(n-1)\cdot m1\cdot NS-m2\}+K3\cdot PFLAG\cdot BP(m),$$

where $a(n)=(I(n-1)\cdot K1)+a(n-1)$, K3 is the gain assigned to the position feedback, PFLAG is the position flag, m1, m2, K2, and NS are as previously described, n is the sample index of CLKIN 140, and K1 is the gain constant dependent upon the input and output sample rates Fs and Fsout.

Multiplier 306 receives buffer pointer 214 from summation block 316 and the position flag (PF) multiplied by K3 primarily to determine the number of slots in buffer 206 that are empty and to prevent overflow or underflow in buffer 206. The position flag (PF) is used to indicate whether a threshold, defined by a range of predetermined number of slots in buffer 206, is filled with samples. The range used for a particular threshold may vary and is selected based upon the current value of the position flag. For the example shown in FIG. 2 where buffer 206 has 64 slots, when position flag is 0, a first threshold may be set such that 8<X<56, where X is the number of slots filled. In other words, when more then 8 slots but less than 56 slots are filled in buffer 206 and position flag is currently set to 0, then position flag remains at 0. In this condition underflow or overflow is unlikely and it is not necessary for 302 to use the position feedback. When the first threshold criteria is not met and the position flag is 0, then the position flag transitions to 1.

A second threshold may be set such that when position flag is 1 and 16<X<48, then position flag is set to 1. In other words, when more then 16 slots but less than 48 slots are filled in buffer 206 and position flag is currently set to 1, then position flag remains at 1. In this condition underflow or overflow is likely and it is necessary for 302 to use the position feedback. When the second threshold criteria is not met and the position flag is 1, then the position flag transitions to 0. In normal operation, position flag will be zero since typically the number of slots filled in buffer 206 meets the first threshold criteria. Upon initialization of digital amplifier system or when a user has made a new "selection", the position flag is set to 1 and buffer pointer feedback 214 is fed through multiplier 306 from summation block 316.

Summation block 302 receives the negative of m2 (which is the ratio of the CLKOUT frequency fclkout and the sampling rate Fsout) and the output of multipliers 304, 306, and 310, and performs a summation operation on the inputted values. The resulting summation value, I(n), is provided to multiplier 318 and multiplier 304. Multiplier 318 multiplies the output of summation block 302 with gain constant K1 and provides its output to summation block 320, where the output of multiplier 318 is added to the previous value of the output of summation block 320, a(n). The output of summation block 320, a(n), is also provided as input to summation block 316.

Summation block 316 receives the output of multiplier 312, which is upsample ratio 136 multiplied by new data (ND) 220, the output of summation block 320 (a(n)), and the previous value output by summation block 316 ($\delta(m-1)$ and $BP(m-1)$). As stated previously, new data 220 is used to represent whether new data (new upsampled processed input 132), has been input into buffer 206. New data 220 may be, for example, a single bit value set to 1 when new data is input to interpolator 102 or set to 0 when there is no new data that has been input into interpolator 102. Upsample ratio 136 is primarily used by summation block 316 to determine the number of new samples 132 being pushed into buffer 206 from interpolator 102. The use of upsample ratio 136 at summation block 316 offsets the push of samples into buffer 206. In one embodiment, the output of summation block 316 includes an integer portion and fractional (decimal) portion, wherein the integer portion of the output of the summation is contained in BP(m) and the fractional portion of the output of the summation is contained in $\delta(m)$.

Referring back to FIG. 1, upsampled output 134 is provided to digital amplifier 108, which may be, for example, a pulse width modulated digital amplifier (as shown in FIG. 1) or a pulse density modulated digital amplifier. Digital amplifier 108 receives upsampled output 134 as a digital input signal, typically in pulse code modulation (PCM) format, and produces output signal 144 (output 144), which may be in the form of a switching signal or a pair of switching signals which accurately represent upsampled output 134. In one embodiment of the present invention, a low pass filter may reside in or be external to digital amplifier 108 and output 144 may be provided to speaker 118 in analog format. Output 144 is provided to speaker 118 for audio output to be listened to by the end user of the digital amplifier system.

In one example of one embodiment of the present invention, assume a CD has been selected by the user of the electronic system 100. The sampling rate Fs is 44.1 KHz, the upsample ratio u is 16, the sampling rate is Fsi is 705.6 KHz, the CLKIN frequency fclkin is 2.8224 MHz, m1 is 4, fclkout is 48 MHz, NS is 17, Fsout is 750 KHz, m2 is 64, K1 is $2^{-31}$, K2 is $2^{-10}$, K3 is $2^{-4}$, PF is 0, $\delta(0)$ is 0, BP(0) is 0, I(0) is 0.5, and a(0) is 1. Assume that slots S1-S64 have been filled with a series of samples and no new data has been received by buffer 206 during the current clock cycle, i.e., ND=0. Selecting a value of m and n at a later time after start-up of electronic system 100 such that m=161313 and n=606093, summation block 316 of digital sampling positioner 208 calculates a(606093)=0.939367, I(606093)=4.138448, $\delta$(161313)=0.055911 and BP(161313)=63. Selector 204 receives the buffer pointer value and selects the predetermined number of consecutive samples from buffer 206 beginning at the buffer pointer location (BP(161313)=63). Lagrange interpolator 202 receives the predetermined number of consecutive samples (5 samples in this case) beginning at BP(161313)=63 and the fractional indicator value ($\delta$(161313)=0.055911) and generates output 134 at a sample rate of 750 MHz.

Embodiments of the present invention have been described in reference to using an asynchronous sample rate converter to generate a buffer pointer and fractional position indicator. The digital sampling positioner of the asynchronous sample rate converter generates the buffer pointer and the fractional position indicator using independent clock signals. Having the digital sampling positioner utilize independent clock signals may allow for relatively low jitter since the CLKOUT signal 142 can be based on a low jitter source like a crystal oscillator or low noise PLL.

In the foregoing specification, the invention has been described with reference to specific embodiments. However, one of ordinary skill in the art appreciates that various modifications and changes can be made without departing from the scope of the present invention as set forth in the claims below. The block diagrams may include different blocks than those illustrated and may have more or less blocks or be arranged differently. For example, blocks 106 and 208 shown in FIG. 1, FIG. 2, and FIG. 3 may be implemented in software or hardware. Accordingly, the specification and figures are to be regarded in an illustrative rather than a restrictive sense, and all such modifications are intended to be included within the scope of present invention.

In one embodiment of the present invention a digital rate converter includes a first interpolator, a buffer, selection circuitry coupled to the buffer, a second interpolator, and a digital sampling positioner. The first interpolator includes an input that receives a data signal at a first sampling rate based on a first clock signal. The first interpolator has an output to provide a data signal at a second sampling rate, wherein the second sampling rate is greater than the first sampling rate as per an upsampling factor. The buffer includes a plurality of buffer positions and an input coupled to the output of the interpolator to receive the data signal provided by the output. The second interpolator is coupled to the selection circuitry. The selection circuitry provides values of a subset of buffer positions of the plurality of buffer positions to the second interpolator dependent on a position indicator. The second interpolator has a data output that provides a data output signal at a third sampling rate, wherein the third sampling rate is based on a second clock signal. The first clock signal and the second clock signal are independent of each other. The output of the second interpolator provides an output value dependent upon a fractional indicator. The digital sampling positioner includes a first output that provides the position indicator and a second output that provides the fractional indicator.

One embodiment of the present invention includes a method of converting a data signal at an input sampling rate to a data signal at an output sampling rate in a digital rate converter. The input data signal is upsampled at a input sampling rate to an intermediate data signal at an intermediate sampling rate, wherein the intermediate sampling rate is greater than the input sampling rate as per an upsampling factor. Sample values of the intermediate data signal are stored into buffer positions of a buffer. A plurality of buffer position values from a first subset of buffer positions of the buffer are provided to an interpolator. The buffer positions that make up the first subset are dependent upon a position indicator. An output data signal is provided at the output of the interpolator at an output sampling rate, wherein a value of the output data signal is dependent upon a fractional indicator provided to the interpolator. The input sampling rate is based on a first clock signal and the output sampling rate is based on a second clock signal, wherein the first clock signal and the second clock signal are independent of each other.

In one aspect of the present invention a digital rate converter includes a first interpolator, a buffer, selection circuitry coupled to the buffer, a second interpolator, and a digital sampling positioner. The first interpolator includes an input that receives a data signal at a first sampling rate, wherein the first sampling rate is based on a first clock signal that has a frequency that is greater than the first sampling rate. The first interpolator has an output to provide a data signal at a second sampling rate. The second sampling rate is greater than the first sampling rate as per an upsampling factor. The buffer includes a plurality of buffer positions and an input coupled to the output of the first interpolator to receive the data signal provided by the output. The second interpolator is coupled to the selection circuitry. The selection circuitry provides values of a subset of buffer positions of the plurality of buffer positions to the second interpolator dependent on a position indicator. The second interpolator has a data output that provides a data output signal at a third sampling rate. The third sampling rate is based on a second clock signal that has a frequency that is greater than the third sampling rate. The first clock signal and the second clock signal are independent of each other. The output of the second interpolator provides an output value dependent upon a fractional indicator. The digital sampling positioner includes a first output for providing the position indicator and a second output for providing the fractional indicator. The position indicator and the fractional indicator are dependent upon a previous value of the position indicator and a previous value of the fractional indicator.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

The invention claimed is:

1. A digital rate converter comprising:
   a first interpolator including an input, the input receiving a data signal at a first sampling rate, the first sampling rate is based on a first clock signal, the first interpolator having an output to provide a data signal at a second sampling rate, the second sampling rate being greater than the first sampling rate as per an upsampling factor;
   a buffer including a plurality of buffer positions and an input coupled to the output of the first interpolator to receive the data signal provided by the output;

selection circuitry coupled to the buffer;
a second interpolator coupled to the selection circuitry, the selection circuitry providing values of a subset of buffer positions of the plurality of buffer positions to the second interpolator dependent on a position indicator, the second interpolator having a data output for providing a data output signal at a third sampling rate, the third sampling rate is based on a second clock signal, wherein the first clock signal and the second clock signal are independent of each other, wherein the output of the second interpolator provides an output value dependent upon a fractional indicator; and
a digital sampling positioner, the digital sampling positioner including a first output for providing the position indicator and a second output for providing the fractional indicator.

2. The converter of claim 1 wherein the first sampling rate is lower than a frequency of the first clock signal and the third sampling rate is lower than a frequency of the second clock signal.

3. The converter of claim 1 wherein the digital sampling positioner has a first input for receiving the first clock signal and a second input for receiving the second clock signal, wherein the position indicator and the fractional indicator are dependent upon the first clock signal and the second clock signal.

4. The converter of claim 1 wherein the subset of buffer positions are consecutive buffer positions of the plurality.

5. The converter of claim 1 wherein the second interpolator is a Lagrange interpolator.

6. The converter of claim 1 wherein the subset of buffer positions includes 5 buffer positions.

7. The converter of claim 1 wherein the fractional indicator is dependent upon a previous value of the fractional indicator.

8. The converter of claim 1 wherein the position indicator is dependent upon a previous value of the position indicator.

9. The converter of claim 1 wherein the third sampling rate is in a range of approximately 0.5 times the second sampling rate to approximately 1.5 times the second sampling rate.

10. The converter of claim 1 wherein the second clock signal is at approximately 48 megahertz.

11. A digital amplifier including the digital rate converter of claim 1 and further comprising:
a pulse width modulated (PWM) digital amplifier including an input coupled to the output of the second interpolator.

12. The digital amplifier of claim 11 wherein the digital amplifier has an output synchronous with the second clock signal.

13. The converter of claim 1 wherein the upsampling factor is based upon a ratio of the first sampling rate and the third sampling rate.

14. The converter of claim 1 wherein first interpolator includes an input to receive an upsampling signal, the upsampling factor is based on the upsampling signal.

15. The converter of claim 1 wherein the output of the second interpolator provides an output value that is an interpolated value offset from a buffer position of the subset of buffer positions, wherein the offset is dependent upon the fractional indicator.

16. The converter of claim 15 wherein the output value is an interpolated value offset from a center buffer position of the subset.

17. The converter of claim 1 wherein the position indicator is dependent upon a previous value of the position indicator and a previous value of the fractional indicator.

18. The converter of claim 1 wherein the fractional indicator is dependent upon a previous value of the position indicator and a previous value of the fractional indicator.

19. The converter of claim 1 wherein
the position indicator and fractional indicator are dependent upon a representation of a ratio of the second sampling rate to the third sampling rate.

20. An electronic system comprising the converter of claim 1 and further comprising:
a digital signal processor coupled to the input to provide the data input signal.

21. The converter of claim 1 wherein the converter includes a physical input, the converter receiving the data signal at the first sampling rate and the first clock signal via the physical input.

22. The converter of claim 1 wherein the position indicator and the fractional indicator are dependent upon a buffer pointer from the buffer.

23. A method of converting a data signal at an input sampling rate to a data signal at an output sampling rate in a digital rate converter, the method comprising:
upsampling the input data signal at a input sampling rate to an intermediate data signal at an intermediate sampling rate wherein the intermediate sampling rate is greater than the input sampling rate as per an upsampling factor;
storing sample values of the intermediate data signal into buffer positions of a buffer;
providing a first plurality of buffer position values from a first subset of buffer positions of the buffer to an interpolator, the buffer positions making up the first subset being dependent upon a position indicator; and
providing at the output of the interpolator a output data signal at an output sampling rate, a value of the output data signal is dependent upon a fractional indicator provided to the interpolator;
wherein the input sampling rate is based on a first clock signal and the output sampling rate is based on a second clock signal, wherein the first clock signal and the second clock signal are independent of each other.

24. The method of claim 23 wherein the input sampling rate is lower than a frequency of the first clock signal and the output sampling rate is lower than a frequency of the second clock signal.

25. The method of claim 23 wherein the position indicator and the fractional indicator are dependent upon the first clock signal and the second clock signal.

26. The method of claim 23 wherein the subset of buffer positions are consecutive buffer positions.

27. The method of claim 23 wherein the interpolator is a Lagrange interpolator.

28. The method of claim 23 wherein the subset of buffer positions includes 5 buffer positions.

29. The method of claim 23 wherein the fractional indicator is dependent upon a previous value of the fractional indicator.

30. The converter of claim 23 wherein the position indicator is dependent upon a previous value of the position indicator.

31. The method of claim 23 wherein the output sampling rate is in a range of approximately 0.5 times the intermediate sampling rate to approximately 1.5 times the intermediate sampling rate.

32. The method of claim 23 wherein said output data signal is input into a pulse width modulated (PWM) digital amplifier.

33. The method of claim 32 wherein said data signal that is input into said pulsed width modulated digital amplifier is synchronous with the second clock signal.

34. The method of claim 23 further comprising:
adjusting the upsampling factor to accommodate a change in the input sampling rate.

35. The method of claim 23 wherein value of the output data signal is an interpolated value offset from a buffer position of the subset of buffer positions, wherein the offset is dependent upon the fractional indicator.

36. The method of claim 35 wherein the output value is an interpolated value offset from a center buffer position of the subset.

37. The method of claim 23 wherein the position indicator is dependent upon a previous value of the position indicator and a previous value of the fractional indicator.

38. The method of claim 23 wherein the fractional indicator is dependent upon a previous value of the position indicator and a previous value of the fractional indicator.

39. The method of claim 23 wherein:
the position indicator and fractional indicator are dependent upon a representation of a ratio of the intermediate sampling rate to the output sampling rate.

40. The method of claim 23 wherein the input data signal is provided by a digital signal processor.

41. The method of claim 23 wherein the upsampling the input data signal, the storing sample values of the intermediate data signal, the providing a first plurality of buffer position values, and the providing at the output of the interpolator are performed by a processor executing code.

42. A digital rate converter comprising:
a first interpolator including an input, the input receiving a data signal at a first sampling rate, the first sampling rate is based on a first clock signal, the first clock signal having a frequency that is greater than the first sampling rate, the first interpolator having an output to provide a data signal at a second sampling rate, the second sampling rate being greater than the first sampling rate as per an upsampling factor;
a buffer including a plurality of buffer positions and an input coupled to the output of the first interpolator to receive the data signal provided by the output;
selection circuitry coupled to the buffer; and
a second interpolator coupled to the selection circuitry, the selection circuitry providing values of a subset of buffer positions of the plurality of buffer positions to the second interpolator dependent on a position indicator, the second interpolator having a data output for providing a data output signal at a third sampling rate, the third sampling rate is based on a second clock signal, the second clock signal having a frequency that is greater than the third sampling rate, wherein the first clock signal and the second clock signal are independent of each other, wherein the output of the second interpolator provides an output value dependent upon a fractional indicator;
a digital sampling positioner, the digital sampling positioner including a first output for providing the position indicator and a second output for providing the fractional indicator, wherein the position indicator and the fractional indicator are dependent upon a previous value of the position indicator and a previous value of the fractional indicator.

* * * * *